United States Patent
Lee et al.

(10) Patent No.: US 8,698,177 B2
(45) Date of Patent: Apr. 15, 2014

(54) ORGANIC LIGHT-EMITTING DISPLAY DEVICE AND METHOD OF MANUFACTURING THE SAME

(75) Inventors: Yong-Han Lee, Yongin (KR); Min-Woo Lee, Yongin (KR); Sung-Jin Choi, Yongin (KR); Jae-Goo Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 42 days.

(21) Appl. No.: 13/241,194

(22) Filed: Sep. 22, 2011

(65) Prior Publication Data

US 2012/0286299 A1 Nov. 15, 2012

(30) Foreign Application Priority Data

May 11, 2011 (KR) .................. 10-2011-0044077

(51) Int. Cl.
*H01L 33/60* (2010.01)
(52) U.S. Cl.
USPC .............................. 257/98; 438/29
(58) Field of Classification Search
USPC .............. 257/E25.008, E33.04, E33.056, 98, 257/123, 59, 57, 172, 89; 438/22, 29; 313/587
See application file for complete search history.

(56) References Cited

U.S. PATENT DOCUMENTS

| | | | |
|---|---|---|---|
| 5,334,411 A | 8/1994 | Pepin | |
| 7,183,710 B2* | 2/2007 | Ahn et al. | 313/587 |
| 7,265,391 B2 | 9/2007 | Yamazaki et al. | |
| 2007/0159071 A1 | 7/2007 | Lee et al. | |
| 2008/0315756 A1* | 12/2008 | Jeon et al. | 313/504 |
| 2009/0021137 A1* | 1/2009 | Sugiura et al. | 313/498 |
| 2009/0167169 A1 | 7/2009 | Lee et al. | |
| 2009/0239091 A1* | 9/2009 | Abe | 428/546 |
| 2009/0309109 A1* | 12/2009 | Chang et al. | 257/89 |
| 2010/0181571 A1* | 7/2010 | Tano et al. | 257/59 |
| 2010/0244070 A1* | 9/2010 | Lee et al. | 257/98 |

FOREIGN PATENT DOCUMENTS

| | | |
|---|---|---|
| JP | 2010-153397 A | 7/2010 |
| KR | 1994-0018885 | 8/1994 |
| KR | 10-2003 0057632 A | 7/2003 |
| KR | 10-2004 0098138 A | 11/2004 |
| KR | 10-2005-0027464 A | 3/2005 |
| KR | 10-2007 0069314 A | 7/2007 |
| KR | 10-2009 0070273 | 7/2009 |

* cited by examiner

*Primary Examiner* — Steven Loke
*Assistant Examiner* — Mouloucoulaye Inoussa
(74) *Attorney, Agent, or Firm* — Christie, Parker & Hale, LLP

(57) ABSTRACT

An organic light-emitting display device is disclosed. The display device includes a substrate; a first electrode on the substrate; an auxiliary electrode patterned on and insulated from the first electrode, and having a top surface that has surface roughness; an intermediate layer on the first electrode and the auxiliary electrode; and a second electrode on the intermediate layer and facing the first electrode. The auxiliary electrode and the second electrode are electrically connected to each other via the surface roughness of the top surface of the auxiliary electrode.

24 Claims, 8 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2011-0044077, filed on May 11, 2011, in the Korean Intellectual Property Office, the entire content of which is incorporated herein by reference.

BACKGROUND

1. Field

Aspects of embodiments of the present invention relate to an organic light-emitting display device.

2. Description of the Related Art

An organic light-emitting display device is a display device including an anode, a cathode, and an intermediate layer interposed between the anode and the cathode. The organic light-emitting display device is expected to become a next generation display device due to its wide viewing angles, high contrast, and fast response speeds. The intermediate layer of the organic light-emitting display device includes an emission layer (EML), and may further include at least one organic layer from among a hole injection layer (HIL), a hole transport layer (HTL), an electron transport layer (ETL), and an electron injection layer (EIL), depending on whether the EML is formed of a polymer organic material or a small molecule organic material. Recently, research aiming to use the organic light-emitting display device not only as a display device but also as a surface light source device has been actively conducted.

One way to build a top-emission type organic light-emitting display device or a dual-emission type organic light-emitting display device is to form a thin metal electrode having a large area. However, the thin metal electrode may have a high resistance such that a voltage drop is incurred due to the resistance. Due to the voltage drop, the organic light-emitting display device may have irregular brightness.

SUMMARY

Aspects of embodiments of the present invention relate to an organic light-emitting display device in which a sheet resistance of a large electrode is improved by forming an auxiliary electrode, and to a method of manufacturing the organic light-emitting display.

According to an exemplary embodiment of the present invention, an organic light-emitting display device is provided. The organic light-emitting display device includes: a substrate; a first electrode on the substrate; an auxiliary electrode patterned on and insulated from the first electrode, and having a top surface that has surface roughness; an intermediate layer on the first electrode and the auxiliary electrode; and a second electrode on the intermediate layer and facing the first electrode. The auxiliary electrode and the second electrode are electrically connected to each other via the surface roughness of the top surface of the auxiliary electrode.

The organic light-emitting display device may further include an insulating layer patterned between the first electrode and the auxiliary electrode.

The auxiliary electrode or the insulating layer may include a stripe pattern, a mesh pattern, or a honeycomb pattern.

A width of the auxiliary electrode may be less than a width of the insulating layer.

The intermediate layer may be commonly formed on the first electrode and the auxiliary electrode. The intermediate layer may include a common layer and an emission layer (EML).

An average depth of the surface roughness of the auxiliary electrode may be greater than a thickness of the intermediate layer.

The intermediate layer may include a first portion on the first electrode and not on the auxiliary electrode, and a second portion on the first electrode and on the auxiliary electrode. The first portion may include an emission layer (EML). The second portion may include a common layer.

An average value of the surface roughness of the auxiliary electrode may be greater than a thickness of the second portion.

The first electrode may completely cover the substrate.

The first electrode may be divided into a plurality of electrode portions on the substrate. The organic light-emitting display device may further include a plurality of pixel circuit units on the substrate and including one or more thin film transistors. The thin film transistors may electrically connect the plurality of electrode portions to respective ones of the plurality of electrode portions.

The first electrode may include a transparent conductive layer.

The auxiliary electrode may include silver (Ag), copper (Cu), aluminum (Al), or an Ag-magnesium (Mg) alloy.

The second electrode may completely cover the intermediate layer.

The second electrode may include a translucent metal thin film.

According to another exemplary embodiment of the present invention, a method of manufacturing an organic light-emitting display device is provided. The method includes: forming a first electrode on a substrate; forming a patterned insulating layer on the first electrode; forming an auxiliary electrode on the insulating layer, a top surface of the auxiliary electrode having surface roughness; forming an intermediate layer on the first electrode and the auxiliary electrode; and forming a second electrode on the intermediate layer to face the first electrode. The auxiliary electrode and the second electrode are electrically connected to each other via the surface roughness of the top surface of the auxiliary electrode.

The insulating layer may include a stripe pattern, a mesh pattern, or a honeycomb pattern.

A width of the auxiliary electrode may be less than a width of the insulating layer.

The forming of the auxiliary electrode may include: aligning a first mask that is patterned to correspond to the insulating layer; and forming the auxiliary electrode of which the top surface has the surface roughness by printing a metal paste via pattern holes of the first mask, and then firing the metal paste.

The metal paste may include silver (Ag), copper (Cu), aluminum (Al), or an Ag-magnesium (Mg) alloy.

The intermediate layer may be commonly formed on the first electrode and the auxiliary electrode. The forming of the intermediate layer may include forming a common layer and an emission layer (EML).

The forming of the intermediate layer may include: commonly forming a first common layer on the first electrode and the auxiliary electrode; forming an emission layer (EML) on the first common layer corresponding to the first electrode and not to the auxiliary electrode; and commonly forming a second common layer on the EML and the first common layer.

The second electrode may include a translucent metal thin film and may completely cover the intermediate layer.

The first electrode may include a transparent conductive material and may completely cover the substrate.

The first electrode may include a transparent conductive material and may be divided into a plurality of electrode portions on the substrate. The method may further include forming a plurality of pixel circuit units that are arranged on the substrate and that include one or more thin film transistors. The thin film transistors may electrically connect the plurality of electrode portions to respective ones of the plurality of electrode portions.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
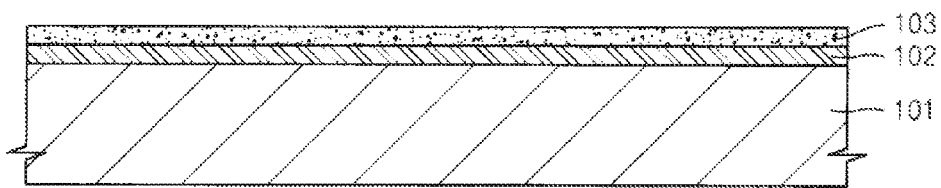
FIGS. 1-3 and 6-7 are cross-sectional views illustrating a method of manufacturing an organic light-emitting display device according to an embodiment of the present invention.

As the invention allows for various changes and numerous embodiments, exemplary embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present application. In the description of embodiments of the present invention that follows, certain detailed explanations of related art are omitted when they may unnecessarily obscure the description of the embodiments.

While such terms as "first," "second," etc., may be used to describe various components, such components need not be limited to the above terms. The above terms are used to distinguish one component from another.

The terms used in the present specification are merely used to describe embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present invention will be described in detail by explaining exemplary embodiments of the invention with reference to the attached drawings. In the drawings, like reference numerals in the drawings denote like elements and the repetitive descriptions thereof are omitted.

Figure 8:
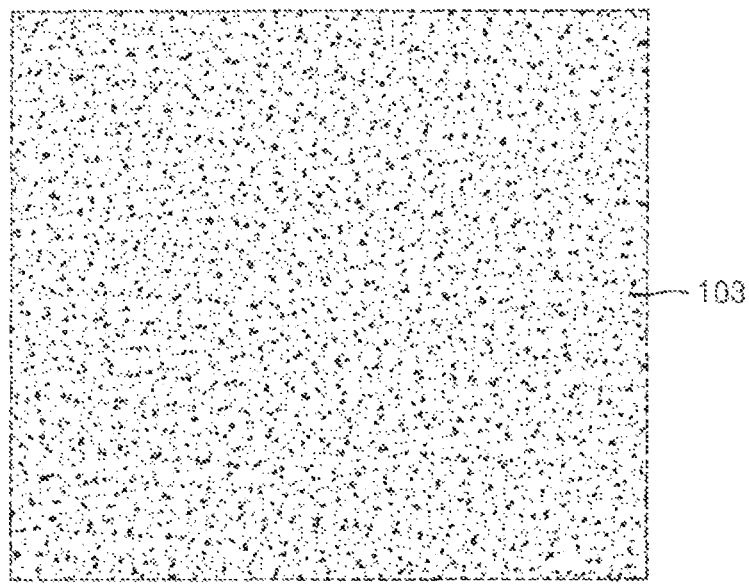
FIGS. 8 through 10 are plan views illustrating the method of manufacturing the organic light-emitting display device according to the embodiment of FIGS. 1-3 and 6-7.
Figure 9:
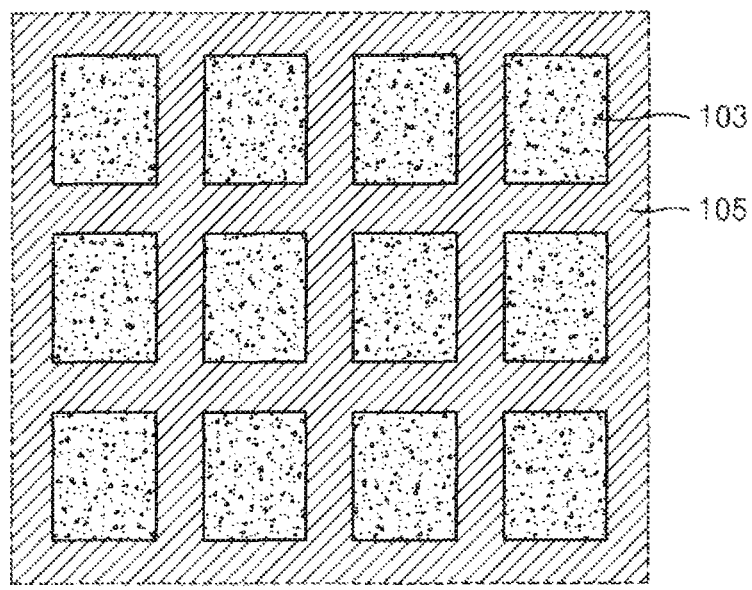
Figure 10:
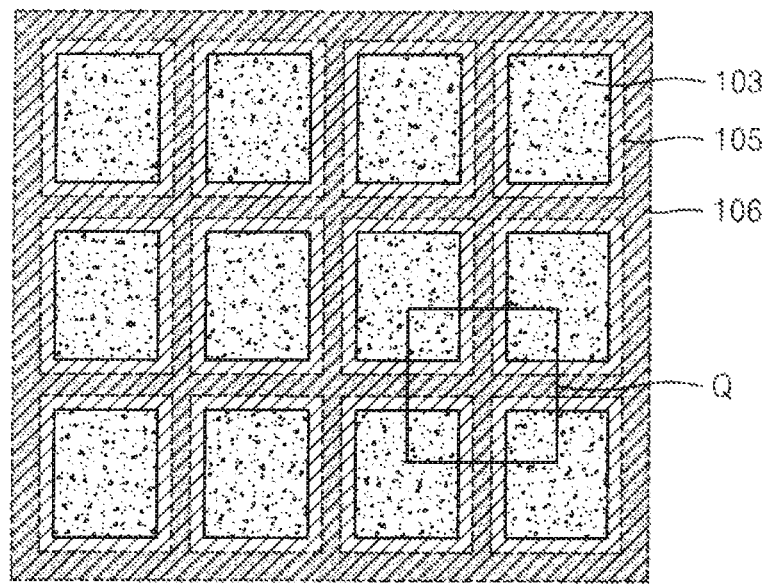
Figure 11:
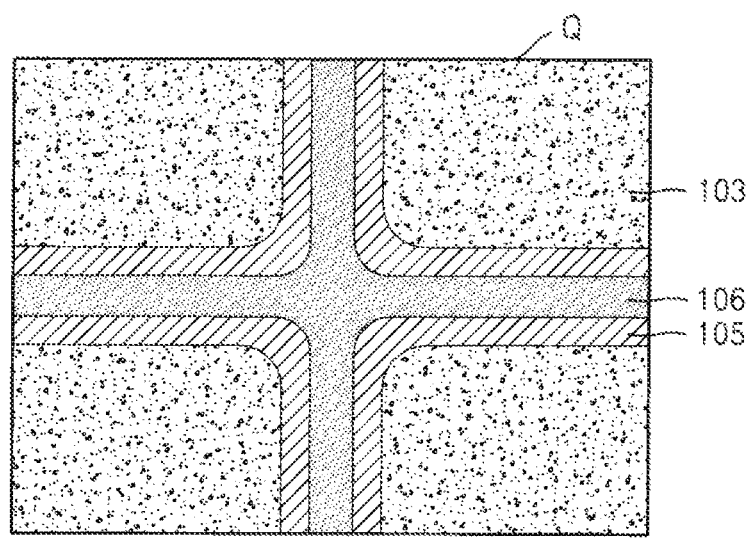
FIG. 11 is a magnified view of a portion Q of FIG. 10.

FIGS. 1-3 and 6-7 are cross-sectional views illustrating a method of manufacturing an organic light-emitting display device 100, according to an embodiment of the present invention. FIGS. 8 through 10 are plan views illustrating the method of manufacturing the organic light-emitting display device 100, according to the embodiment of FIGS. 1-3 and 6-7. FIG. 11 is a magnified view of a portion Q of FIG. 10.

Referring to FIG. 1, first, a substrate 101 is prepared. The substrate 101 may be formed of an insulating material, e.g., the substrate 101 may be a glass substrate or a plastic substrate. The substrate 101 may include a transparent substrate, a translucent substrate, or an opaque substrate according to whether the organic light-emitting display device 100 is a dual-emission type, a top-emission type, or a bottom-emission type display device.

A first electrode 103 is formed on the substrate 101. The first electrode 103 may be an anode having positive (+) polarity. As illustrated in FIG. 8, the first electrode 103 may completely cover a top surface of the substrate 101.

When the organic light-emitting display device 100 is a bottom-emission type display device, the first electrode 103 may be formed as a transparent conductive layer having excellent conductivity, e.g., an indium tin oxide (ITO) layer or an indium zinc oxide (IZO) layer, to permit light to pass through toward the substrate 101. When the organic light-emitting display device 100 is a top-emission type display device, the first electrode 103 may further include a reflective layer capable of reflecting light away from the substrate 101. The reflective layer may include silver (Ag) or aluminum (Al). At least one side of the first electrode 103 may be connected to a first power voltage applying unit (not shown), so that a positive voltage may be applied thereto.

A buffer layer 102 may be further formed between the substrate 101 and the first electrode 103. The buffer layer 102 provides a planar surface on the substrate 101, and reduces or prevents moisture and foreign substances from penetrating into the substrate 101. The buffer layer 102 may be formed of an insulating material including silicon oxide ($SiO_2$).

Figure 2:
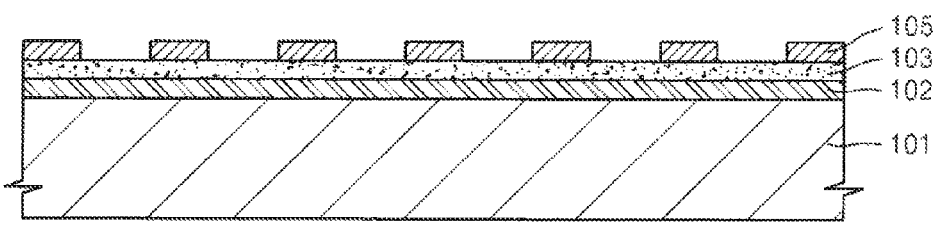

Referring to FIG. 2, a patterned insulating layer 105 is formed on the first electrode 103.

Figure 3:
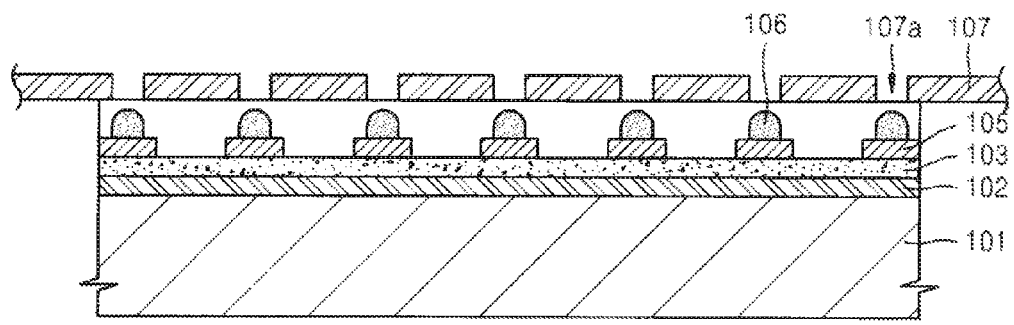

The insulating layer 105 is formed to prevent electrical connection between the first electrode 103 and an auxiliary electrode 106 (refer to FIG. 3). The auxiliary electrode 106 is electrically connected to a second electrode 109 (refer to FIG. 7), so that a second power voltage that is applied to the second electrode 109 flows through the auxiliary electrode 106. Here, if the auxiliary electrode 106 and the first electrode 103 directly contact each other without the insulating layer 105 therebetween, a short may occur between a first power voltage applied to the first electrode 103 and the second power voltage applied to the auxiliary electrode 106. Thus, to prevent an electrical problem, the insulating layer 105 is formed.

The insulating layer 105 may be formed, for example, to have a stripe pattern, a mesh pattern, or a honeywell (honeycomb) pattern. However, a pattern type of the insulating layer 105 is not limited thereto. In other embodiments, the insulating layer 105 may have one of various pattern types including, for example, a triangle pattern, a diamond pattern, a trapezoid pattern, a pattern formed by sequentially connecting polygons, a circular pattern, an oval pattern, or a pattern formed by sequentially connecting geometrical figures. For example, FIG. 9 illustrates the insulating layer 105 having a mesh pattern.

When the insulating layer 105 is formed to cover almost every portion of the first electrode 103, an emission region may be decreased so that brightness of the organic light-emitting display device 100 decreases. Thus, the insulating layer 105 may be formed to have an opening or openings to match a pattern of the auxiliary electrode 106. In addition, to reduce or minimize a decrease in an aperture ratio, the insulating layer 105 may be formed of transparent polymer, e.g., transparent acryl-based polymer or transparent epoxy-based polymer.

The auxiliary electrode 106 is formed to reduce or prevent a voltage drop of the second electrode 109. The second electrode 109 has a large area, which can cause a large sheet resistance and a consequential voltage drop.

Referring to FIG. 3, the auxiliary electrode 106 is formed on the insulating layer 105.

The auxiliary electrode 106 reduces or prevents the voltage drop that is incurred due to the sheet resistance of the second electrode 109 having the large area. Similar to the insulating layer 105, the auxiliary electrode 106 is patterned according to a set or predetermined shape. Since the auxiliary electrode 106 is intended to be electrically insulated from the first electrode 103, the pattern of the auxiliary electrode 106 may be substantially the same as the pattern of the insulating layer 105 that is on the first electrode 103.

As shown in FIG. 3, a width of the auxiliary electrode 106 is less than a width of the insulating layer 105. FIG. 10 also illustrates the auxiliary electrode 106 having a width less than the width of the insulating layer 105. FIG. 11 is the magnified view of the portion Q of FIG. 10. Referring to FIG. 11, the auxiliary electrode 106 is formed on the insulating layer 105, with the auxiliary electrode 106 having a smaller width than the insulating layer 105.

The auxiliary electrode 106 is electrically connected to the second electrode 109 having a large area. Accordingly, the auxiliary electrode 106 should be insulated from the first electrode 103. If the width of the auxiliary electrode 106 is greater than the width of the insulating layer 105, there is a possibility that the auxiliary electrode 106 will contact the first electrode 103. Thus, the width of the auxiliary electrode 106 should be less than the width of the insulating layer 105. A height of the auxiliary electrode 106 may be sufficiently large so as to have a low resistance.

The auxiliary electrode 106 is formed using a simple method such as screen printing, instead of using a complicated method such as deposition. In more detail, referring to FIG. 3, a patterned first mask 107 is aligned on the insulating layer 105, a metal paste is printed via pattern holes 107*a* of the first mask 107, and the metal paste is fired, so that the auxiliary electrode 106 is formed. The metal paste may be a mixture of metal particles and a binder material. The metal particles may be a low resistance metal material, e.g., silver (Ag), copper (Cu), aluminum (Al), or an Ag-magnesium (Mg) alloy. However, a material of the metal particle is not limited thereto. For example, other materials having a low resistance, such as Mg, platinum (Pt), lead (Pb), gold (Au), nickel (Ni), chrome (Cr), or the like may be used.

According to the embodiment of FIGS. 1-3 and 6-7, in a process in which the metal paste is printed on the insulating layer 105 and is fired by applying heat thereto, the binder material vanishes and only the metal from the metal particles remains on the insulating layer 105. Due to the remaining metal, a top surface of the auxiliary electrode 106 may have a particular surface roughness (for example, a predetermined surface roughness). Here, the surface roughness refers to a depth of a groove formed in the top surface of the auxiliary electrode 106.

Figure 4:
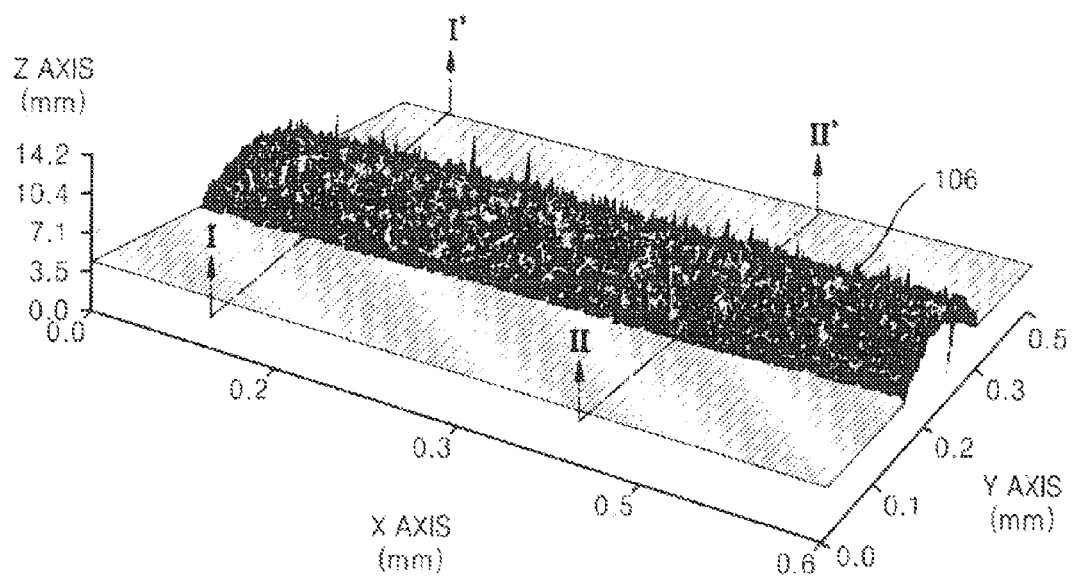
FIG. 4 three-dimensionally illustrates surface roughness of a top surface of an auxiliary electrode.
Figure 5A:
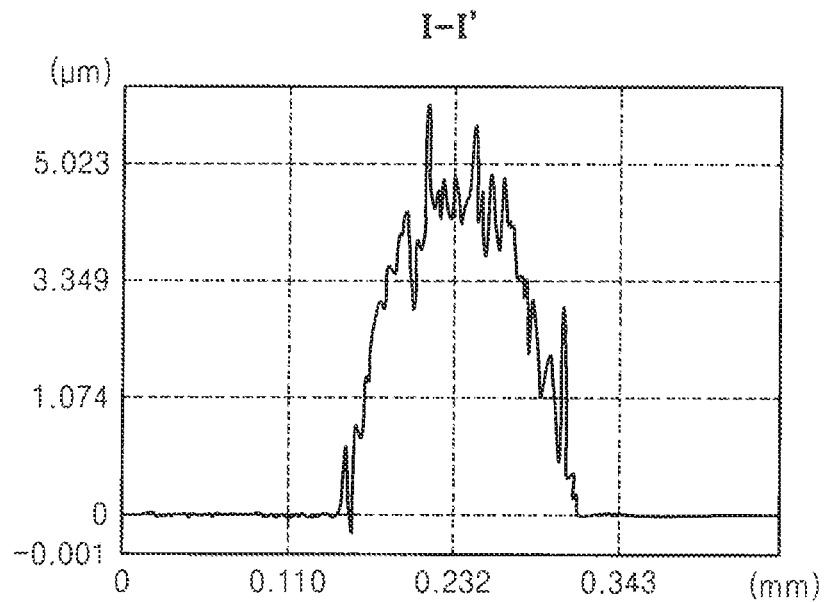
FIG. 5 illustrates cross-sectional views of the surface roughness, taken along the lines I-I' and II-II of FIG. 4.
Figure 5B:
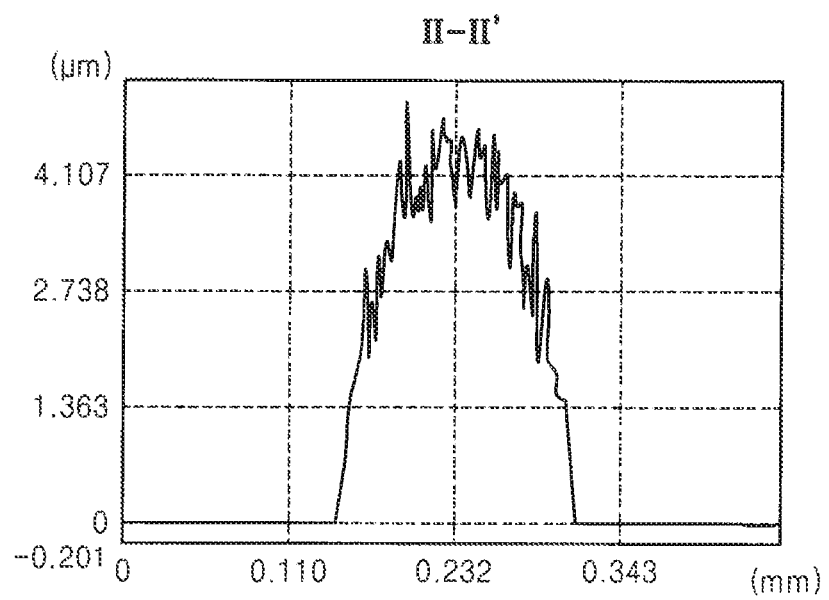

FIG. 4 three-dimensionally illustrates the surface roughness of the top surface of the auxiliary electrode 106. FIG. 5 illustrates cross-sectional views of the surface roughness, taken along the lines I-I' and II-II' of FIG. 4.

Referring to FIGS. 4 and 5, the top surface of the auxiliary electrode 106 has grooves having set or predetermined depths. An average of the surface roughness of the auxiliary electrode 106 may be between about 500 nm and about 1 um. When the average of the surface roughness is less than about 500 nm, a depth of an average groove is less than a thickness of an intermediate layer 108 (refer to FIG. 6), such that it is difficult for the auxiliary electrode 106 to be electrically connected to the second electrode 109 after penetrating through the intermediate layer 108. When the average of the surface roughness is greater than about 1 um, a surplus of a groove may be damaged by being broken or bent.

Figure 6:
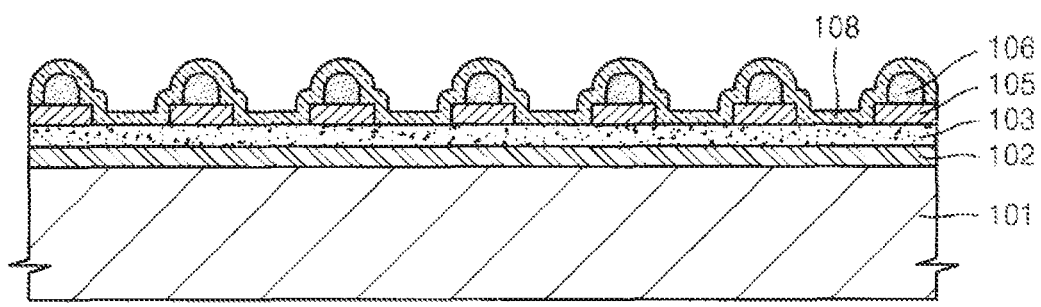

Referring to FIG. 6, the intermediate layer 108 is completely formed on the first electrode 103 and the auxiliary electrode 106. The intermediate layer 108 may include a common layer (or common layers) and an emission layer (EML). A type of the common layer may be dependent on whether an emission organic material for the EML is formed of a small molecule organic material or a polymer organic material.

For example, if the EML is formed of the small molecule organic material, the common layer may have a single or composite structure in which a hole injection layer (HIL), a hole transport layer (HTL), the EML (for example, an organic EML), an electron transport layer (ETL), and an electron injection layer (EIL) are stacked. The EML that is formed of the small molecule organic material may be formed using a vacuum deposition method using masks.

If the EML is formed of the polymer organic material, the common layer may include an HTL, and the HTL may be formed of PEDOT (Poly(3,4-ethylenedioxythiophene)). Here, the EML is formed using the polymer organic material including a Poly-p-phenylene vinylene (PPV)-based polymer organic material, a polyfluorene-based polymer organic material, or the like. The EML that is formed of the polymer organic material may be formed using a screen print method, an ink jet print method, or the like.

In order to make the intermediate layer 108 emit a white color, the EML may have a complete dual-layer structure. In more detail, the dual-layer structure may be formed such that a blue organic EML is first formed and then a red organic EML and a green organic EML are mixed and deposited on the blue organic EML. However, it is sufficient for the intermediate layer 108 to include at least one organic EML, and thus, the present embodiment is not limited to the aforementioned description.

According to the embodiment of FIGS. 1-3 and 6-7, an average value of the surface roughness of the auxiliary electrode 106 is greater than the thickness of the intermediate layer 108. For example, the thickness of an intermediate layer 108 may be no more than 500 nm. In this case, it is sufficient as long as the average value of the surface roughness of the auxiliary electrode 106 is equal to or greater than about 500 nm. However, as described above, a maximum value of the average value of the surface roughness may be about 1 um at which the auxiliary electrode 106 is not damaged.

Regardless of the intermediate layer 108, the auxiliary electrode 106 and the second electrode 109 are supposed to be electrically connected to each other. Here, a top portion of the auxiliary electrode 106 having a greater average value of surface roughness than the thickness of the intermediate layer 108 may not be covered by the intermediate layer 108, but may instead be exposed. The exposed portion of the auxiliary electrode 106 contacts the second electrode 109 (refer to FIG. 7 magnified portion) to be formed later, so that the auxiliary electrode 106 and the second electrode 109 are electrically connected to each other. In addition, the thickness of the intermediate layer 108 may vary according to the surface roughness of the auxiliary electrode 106. Here, electric field concentration may be incurred in a region of the intermediate layer 108 having a relatively small thickness, so that a short may occur. By electrical shorting, the auxiliary electrode 106 and the second electrode 109 may be electrically connected to each other.

Figure 7:
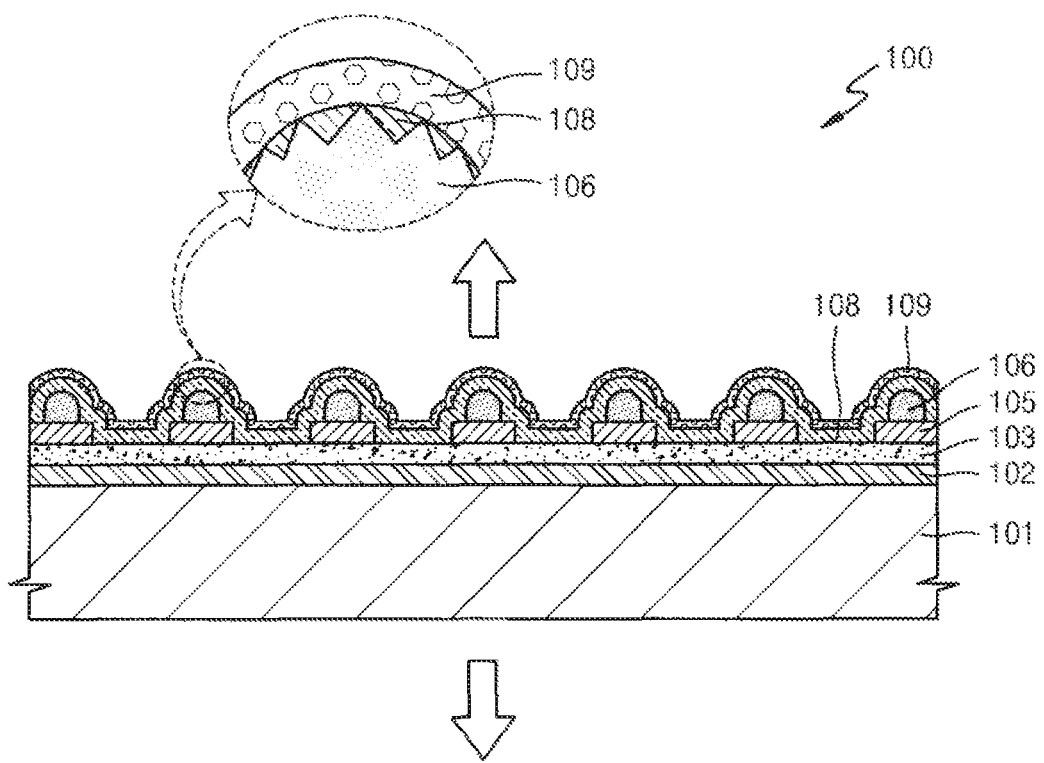

Referring to FIG. 7, the second electrode 109 is completely formed on the intermediate layer 108. The second electrode 109 may be a cathode having negative (−) polarity. The second electrode 109 is formed of a material having excellent conductivity, e.g., Ag, Al, Mg, or the like. At least one side of the second electrode 109 may be connected to a second power voltage applying unit (not shown), so that a negative voltage may be applied thereto.

When the organic light-emitting display device 100 is a dual-emission type or a top-emission type display device, the second electrode 109 may be formed as a translucent thin film having a thickness between about 100 Å and about 300 Å, to have high transmittance to allow light to be emitted through the second electrode 109 from the intermediate layer 108. The second electrode 109 has the large area to completely cover the substrate 101, and is formed as a thin film for high light transmittance, and thus, the second electrode 109 may have a high sheet resistance. In particular, a large voltage drop may be incurred in a portion of the second electrode 109 that is distant from the one side of the second electrode 109 to which a second power voltage is applied. Accordingly, a problem of an irregular brightness difference may occur.

However, in the organic light-emitting display device 100 according to the embodiment of FIGS. 1-3 and 6-7, as illustrated in the magnified portion in FIG. 7, the auxiliary electrode 106 having the surface roughness contacts the second electrode 109. Since the auxiliary electrode 106 is patterned on an entire surface of the organic light-emitting display device 100, the portion of the second electrode 109 in which the voltage drop may occur has a decreased resistance so that the voltage drop may be reduced or prevented.

Figure 12:
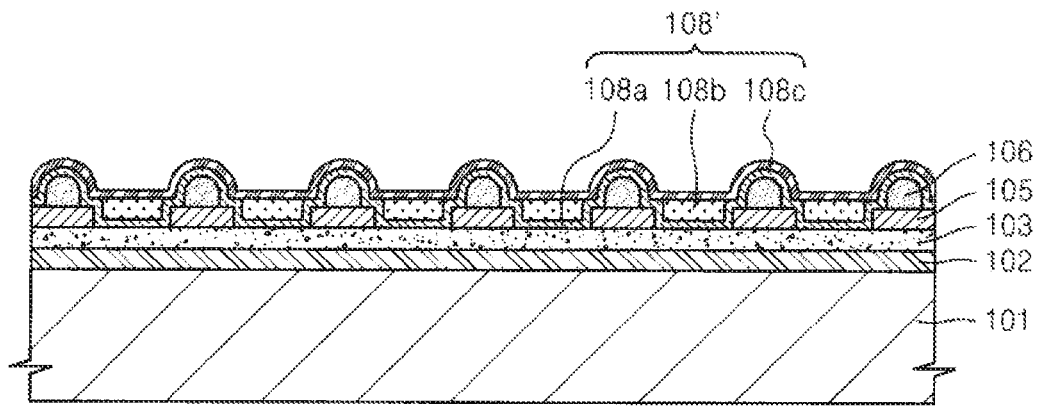
FIGS. 12 and 13 illustrate a method of manufacturing an organic light-emitting display device according to another embodiment of the present invention.
Figure 13:
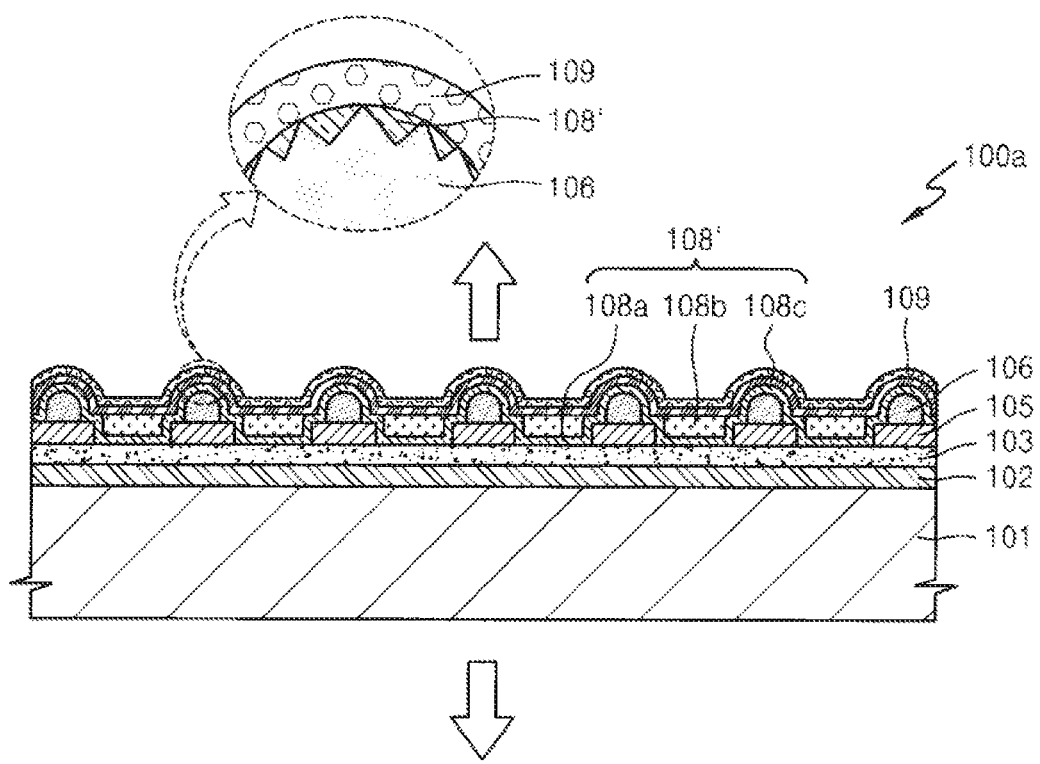

FIGS. 12 and 13 illustrate a method of manufacturing an organic light-emitting display device 100a according to another embodiment of the present invention.

The organic light-emitting display device 100a of FIG. 13 is different from the organic light-emitting display device 100 of FIG. 7 in a method of forming an intermediate layer 108' and a structure of the intermediate layer 108'. The remaining configuring elements and a method of manufacturing them are the same as the organic light-emitting display device 100 of FIG. 7. Thus, detailed descriptions, which are the same as those of the aforementioned embodiment, will not be repeated.

Referring to FIG. 12, the intermediate layer 108' is formed on a first electrode 103 and an auxiliary electrode 106. The intermediate layer 108' includes first and second common layers 108a and 108c, and an EML 108b. The common layers 108a and 108c are commonly formed on the first electrode 103 and the auxiliary electrode 106. However, the EML 108b is formed only on portions corresponding to the first electrode 103 (and not the auxiliary electrode 106).

Here, since the EML 108b and an adjacent EML 108b are separate from each other with an insulating layer 105 and the auxiliary electrode 106 therebetween, the EML 108b and the adjacent EML 108b may include organic materials emitting different colors. For example, the EML 108b may include only a blue organic EML, and the adjacent EML 108b may include only a red organic EML. In order to form the intermediate layer 108' shown in FIG. 12, the common layers 108a and 108c may be formed to completely cover a substrate 101, and the EML 108b may be separately formed using a fine metal mask (FMM) in which pattern holes are formed at desired positions.

As described above, when the EML 108b is formed of a small molecule organic material, the common layers 108a and 108c may have a single or composite structure in which a HIL, a HTL, an organic EML, an ETL, and an EIL are stacked. Here, the HIL and the HTL are formed as the first common layer 108a and are formed near the first electrode 103. The ETL and the EIL are formed as the second common layer 108c and are formed near a second electrode 109.

When the EML 108b is formed of a polymer organic material, the common layers 108a and 108c may have a HTL as the first common layer 108a. In this case, the second common layer 108c may be omitted.

Referring to FIG. 13, the second electrode 109 is completely formed on the intermediate layer 108'. In the organic light-emitting display device 100a according to the embodiment of FIGS. 12-13, an average value of surface roughness of the auxiliary electrode 106 is sufficient as long as the average value is greater than a thickness of the common layers 108a and 108c. This is because it is sufficient as long as a portion of a top surface of the auxiliary electrode 106 contacts the second electrode 109. In this regard, only the common layers 108a and 108c are formed on the top surface of the auxiliary electrode 106. Here, an average value of the surface roughness of the auxiliary electrode 106 is greater than a combined thickness of the first and second common layers 108a and 108c (or a thickness of the first common layer 108a when there is no second common layer 108c).

Figure 14:
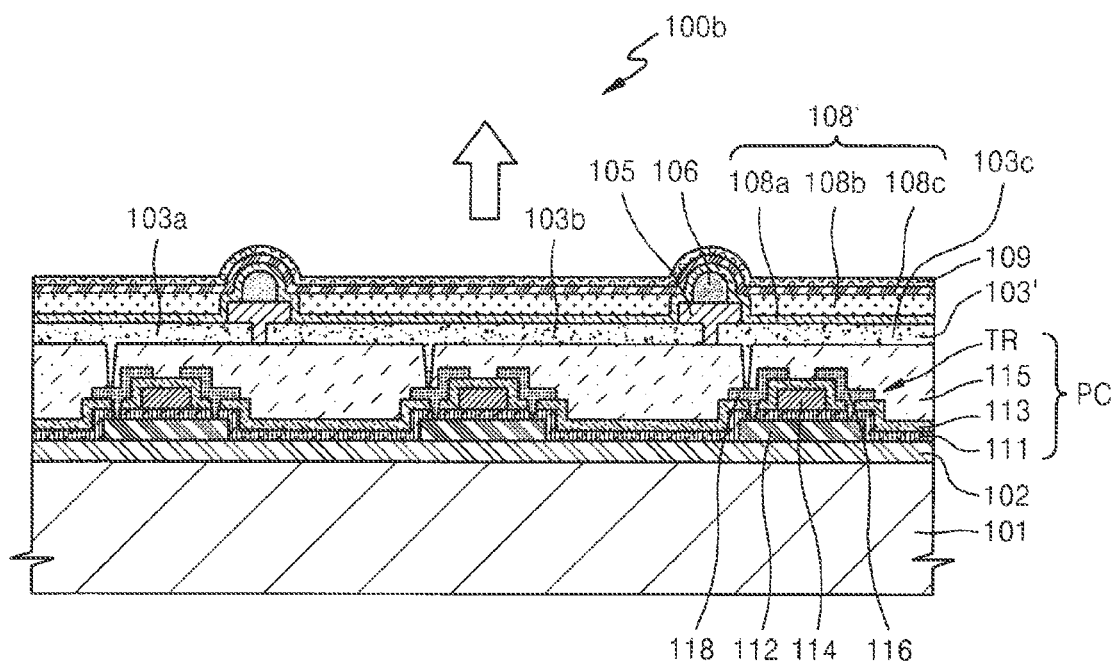
FIG. 14 illustrates an organic light-emitting display device according to yet another embodiment of the present invention.

FIG. 14 illustrates an organic light-emitting display device 100b according to yet another embodiment of the present invention.

The organic light-emitting display device 100b of FIG. 14 is different from the organic light-emitting display devices 100 and 100a according to the previous embodiments of FIGS. 7 and 13, respectively, in that a first electrode 103' is divided into a plurality of electrode portions 103a, 103b, and 103c, and the organic light-emitting display device 100b further includes pixel circuit units PC that are connected to the electrode portions 103a, 103b, and 103c, respectively. The remaining elements and a method of manufacturing them are the same as the organic light-emitting display devices 100 and 100a. Thus, detailed descriptions, which are the same as for the aforementioned embodiments, will not be repeated.

Referring to FIG. 14, the pixel circuit units PC including at least one thin film transistor TR are formed on a substrate 101 by having a predetermined distance therebetween. FIG. 14 illustrates a structure of only one thin film transistor TR that is a top gate type including an active layer 112 that is formed on the substrate 101; a gate electrode 114 that is formed on the active layer 112, with the gate electrode 114 being insulated from the active layer 112 by using a gate insulating layer 111; and source/drain electrodes 116 and 118 that are formed on the gate electrode 114 to contact the active layer 112, with the source/drain electrodes 116 and 118 being insulated from the gate electrode 114 by using an interlayer insulating layer 113. However, the pixel circuit unit PC may include two or more thin film transistors TR, and at least one capacitor. The structure of the thin film transistor TR is not limited thereto, and thus may be a bottom gate type.

A passivation layer 115 may be formed between the thin film transistor TR and the first electrode 103' to planarize a surface whereon the first electrode 103' is formed. The drain electrode 118 of the thin film transistor TR is electrically connected to the first electrode 103'. Here, the first electrode 103' is divided into the plurality of electrode portions 103a, 103b, and 103c and thus has an island form that is separate in each pixel circuit unit PC. Thus, the pixel circuit units PC respectively adjust current applied to the electrode portions 103a, 103b, and 103c, and by doing so, the intermediate layer 108' on the electrode portions 103a, 103b, or 103c may emit light or may not emit light. Accordingly, the organic light-emitting display device 100b may emit light for each intermediate layer 108' (for example, each EML 108b) on the electrode portions 103a, 103b, or 103c, which are connected to respective ones of the pixel circuit units PC.

Referring to FIG. 14, the first electrode 103' overlaps with the pixel circuit units PC to cover the pixel circuit units PC. In this case, the first electrode 103 includes a reflective layer, and the organic light-emitting display device 100b is a top-emission type display device in which light is emitted toward the second electrode 109. However, other embodiments are not limited thereto, and thus, the first electrode 103 may be disposed not to cover the pixel circuit units PC. In this case, the organic light-emitting display device 100b may be a dual-emission type or a bottom-emission type display device, according to whether the second electrode 109 is a transparent electrode or a reflective electrode.

In an organic light-emitting display device according to one or more embodiments, uniform brightness may be achieved by improving a sheet resistance of a large electrode by using an auxiliary electrode that is electrically connected to the large electrode. In addition, by forming the auxiliary electrode before forming the intermediate layer including an organic material, damage to the intermediate layer may be reduced or minimized.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display device comprising:
a substrate;
a first electrode on the substrate;
an auxiliary electrode patterned on and insulated from the first electrode, and having a top surface that has surface roughness;
an intermediate layer on the first electrode and the auxiliary electrode and comprising at least one of a hole injection layer, a hole transport layer, an emission layer (EML), an electron transport layer, or an electron injection layer; and
a second electrode on the intermediate layer and facing the first electrode,
wherein the auxiliary electrode and the second electrode are electrically connected to each other via the surface roughness of the top surface of the auxiliary electrode penetrating through the intermediate layer.

2. The organic light-emitting display device of claim 1, further comprising an insulating layer patterned between the first electrode and the auxiliary electrode.

3. The organic light-emitting display device of claim 2, wherein the auxiliary electrode or the insulating layer comprises a stripe pattern, a mesh pattern, or a honeycomb pattern.

4. The organic light-emitting display device of claim 2, wherein a width of the auxiliary electrode is less than a width of the insulating layer.

5. The organic light-emitting display device of claim 1, wherein
the intermediate layer is commonly formed on the first electrode and the auxiliary electrode, and
the intermediate layer comprises a common layer and the EML.

6. The organic light-emitting display device of claim 5, wherein an average depth of the surface roughness of the auxiliary electrode is greater than a thickness of the intermediate layer.

7. The organic light-emitting display device of claim 1, wherein
the intermediate layer comprises
a first portion on the first electrode and not on the auxiliary electrode, and
a second portion on the first electrode and on the auxiliary electrode,
the first portion comprises the EML, and
the second portion comprises a common layer.

8. The organic light-emitting display device of claim 7, wherein an average value of the surface roughness of the auxiliary electrode is greater than a thickness of the second portion.

9. The organic light-emitting display device of claim 1, wherein the first electrode completely covers the substrate.

10. The organic light-emitting display device of claim 1, wherein the first electrode is divided into a plurality of electrode portions on the substrate, the organic light-emitting display device further comprises a plurality of pixel circuit units on the substrate and comprising one or more thin film transistors.

11. The organic light-emitting display device of claim 1, wherein the first electrode comprises a transparent conductive layer.

12. The organic light-emitting display device of claim 1, wherein
the auxiliary electrode comprises silver (Ag), copper (Cu), aluminum (Al), or an Ag-magnesium (Mg) alloy.

13. The organic light-emitting display device of claim 1, wherein the second electrode completely covers the intermediate layer.

14. The organic light-emitting display device of claim 1, wherein the second electrode comprises a translucent metal thin film.

15. A method of manufacturing an organic light-emitting display device, the method comprising:
forming a first electrode on a substrate;
forming a patterned insulating layer on the first electrode;
forming an auxiliary electrode on the insulating layer, a top surface of the auxiliary electrode having surface roughness;
forming an intermediate layer on the first electrode and the auxiliary electrode and comprising at least one of a hole injection layer, a hole transport layer, an emission layer (EML), an electron transport layer, or an electron injection layer; and
forming a second electrode on the intermediate layer to face the first electrode,
wherein the auxiliary electrode and the second electrode are electrically connected to each other via the surface roughness of the top surface of the auxiliary electrode penetrating through the intermediate layer.

16. The method of claim 15, wherein the insulating layer comprises a stripe pattern, a mesh pattern, or a honeycomb pattern.

17. The method of claim 15, wherein a width of the auxiliary electrode is less than a width of the insulating layer.

18. The method of claim 15, wherein the forming of the auxiliary electrode comprises:
 aligning a first mask that is patterned to correspond to the insulating layer; and
 forming the auxiliary electrode of which the top surface has the surface roughness by printing a metal paste via pattern holes of the first mask, and then firing the metal paste.

19. The method of claim 18, wherein the metal paste comprises silver (Ag), copper (Cu), aluminum (Al), or an Ag-magnesium (Mg) alloy.

20. The method of claim 15, wherein
 the intermediate layer is commonly formed on the first electrode and the auxiliary electrode, and
 the forming of the intermediate layer comprises forming a common layer and the EML.

21. The method of claim 15, wherein the forming of the intermediate layer comprises:
 forming a first common layer on the first electrode and the auxiliary electrode;
 forming the EML on the first common layer corresponding to the first electrode and not to the auxiliary electrode; and
 forming a second common layer on the EML and the first common layer.

22. The method of claim 15, wherein the second electrode comprises a translucent metal thin film and completely covers the intermediate layer.

23. The method of claim 15, wherein the first electrode comprises a transparent conductive material and completely covers the substrate.

24. The method of claim 15, wherein the first electrode comprises a transparent conductive material and is divided into a plurality of electrode portions on the substrate, the method further comprises forming a plurality of pixel circuit units that are arranged on the substrate and that comprise one or more thin film transistors.

\* \* \* \* \*